(12) United States Patent
Curatola et al.

(10) Patent No.: US 9,406,673 B2
(45) Date of Patent: Aug. 2, 2016

(54) SEMICONDUCTOR COMPONENT WITH TRANSISTOR

(71) Applicant: Infineon Technologies Austria AG, Villach (AT)

(72) Inventors: Gilberto Curatola, Villach (AT); Oliver Haeberlen, Villach (AT); Walter Rieger, Villach (AT); Anthony Sanders, Weissenfeld (DE)

(73) Assignee: Infineon Technologies Austria AG, Villach (AT)

( * ) Notice: Subject to any disclaimer, the term of this patent is extended or adjusted under 35 U.S.C. 154(b) by 290 days.

(21) Appl. No.: 14/138,266

(22) Filed: Dec. 23, 2013

(65) Prior Publication Data

US 2015/0179643 A1   Jun. 25, 2015

(51) Int. Cl.
| | | |
|---|---|---|
| H01L 27/088 | (2006.01) | |
| H01L 29/205 | (2006.01) | |
| H01L 29/778 | (2006.01) | |
| H03K 17/567 | (2006.01) | |
| H01L 29/20 | (2006.01) | |
| H01L 27/06 | (2006.01) | |
| H01L 29/417 | (2006.01) | |
| H01L 29/423 | (2006.01) | |

(52) U.S. Cl.
CPC .......... *H01L 27/0883* (2013.01); *H01L 29/205* (2013.01); *H01L 29/7786* (2013.01); *H01L 29/7787* (2013.01); *H03K 17/567* (2013.01); *H01L 27/0605* (2013.01); *H01L 29/2003* (2013.01); *H01L 29/41758* (2013.01); *H01L 29/4236* (2013.01)

(58) Field of Classification Search
CPC .............. H01L 27/0883; H01L 29/205; H01L 29/7786; H01L 29/7787; H03K 17/567
See application file for complete search history.

(56) References Cited

U.S. PATENT DOCUMENTS

| | | | | |
|---|---|---|---|---|
| 6,373,318 | B1 * | 4/2002 | Dohnke | H01L 27/085 257/E27.059 |
| 7,082,020 | B2 * | 7/2006 | Friedrichs | H01L 27/085 257/E27.059 |
| 7,087,957 | B2 * | 8/2006 | Matsuda | H01L 27/0605 257/330 |
| 7,719,055 | B1 | 5/2010 | McNutt et al. | |
| 7,777,553 | B2 * | 8/2010 | Friedrichs | H03K 17/567 327/436 |
| 8,487,667 | B2 * | 7/2013 | Iwamura | H03K 17/567 327/108 |
| 9,048,119 | B2 * | 6/2015 | Kanazawa | H01L 27/0883 |
| 9,087,718 | B2 * | 7/2015 | Lal | H01L 27/0883 |
| 9,159,725 | B2 * | 10/2015 | Forghani-Zadeh | H01L 27/0883 |

* cited by examiner

*Primary Examiner* — Jeffrey Zweizig
(74) *Attorney, Agent, or Firm* — Murphy, Bilak & Homiller, PLLC

(57) ABSTRACT

One aspect relates to a semiconductor component with a semiconductor body, a first main contact pad, a second main contact pad, a normally-on first transistor monolithically integrated in the semiconductor body and a normally-off second transistor monolithically integrated in the semiconductor body. The first transistor is a high electron mobility transistor having a first gate electrode and a first load path controllable via a first gate electrode, and the second transistor has a second gate electrode and a second load path controllable via the second gate electrode. The first load path and the second load path are electrically connected in series between the first main contact pad and the second main contact pad.

27 Claims, 5 Drawing Sheets

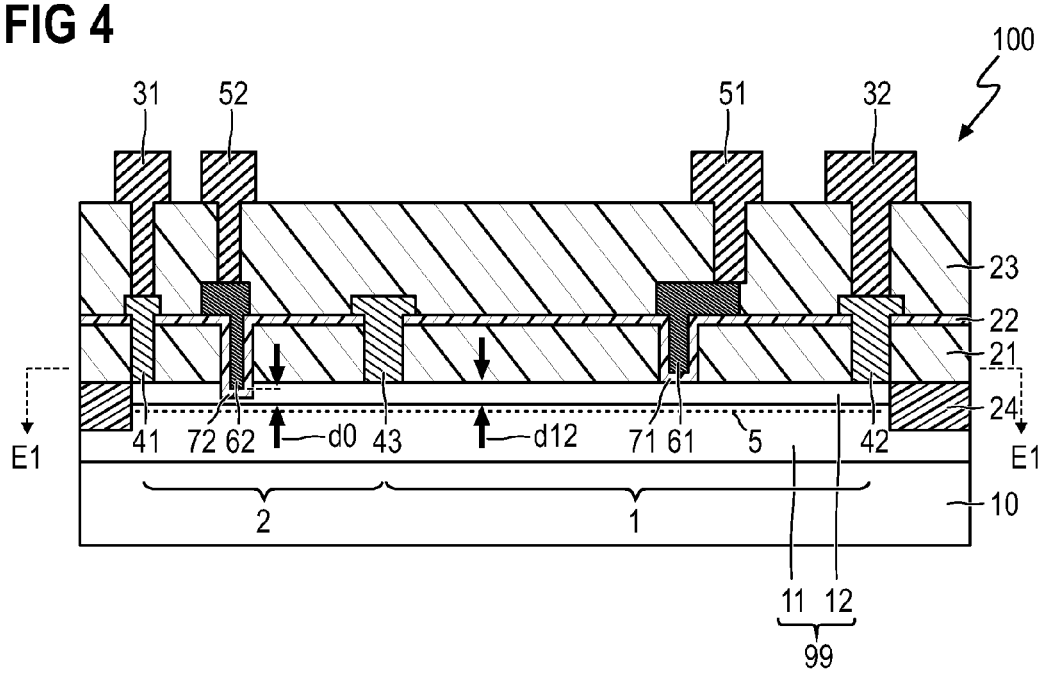
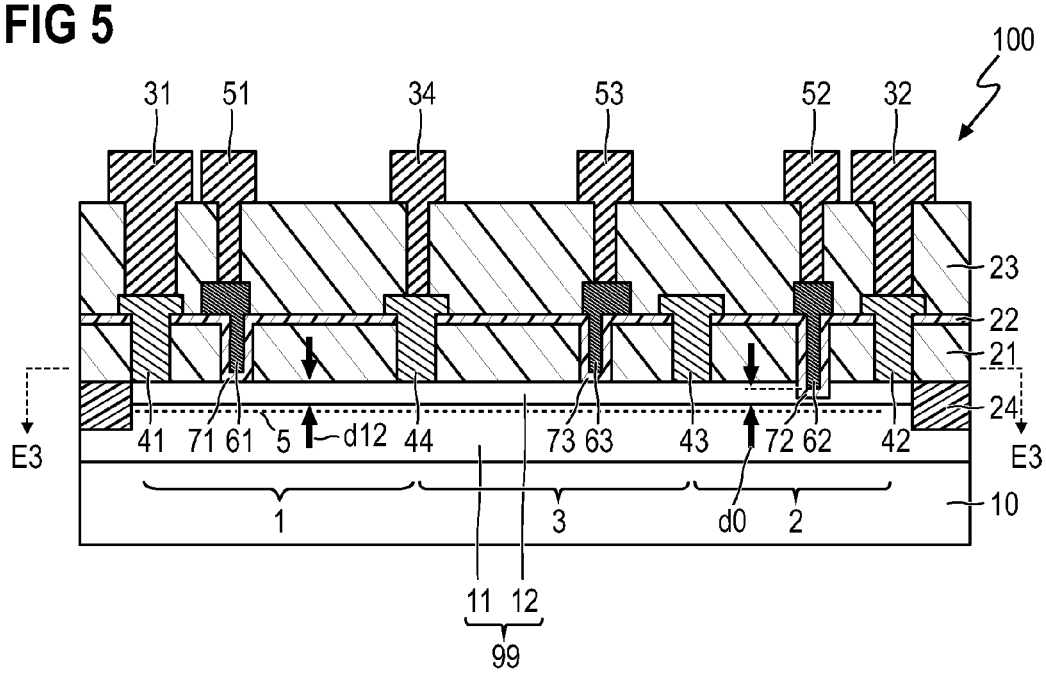

SEMICONDUCTOR COMPONENT WITH TRANSISTOR

FIELD OF TECHNOLOGY

The present application relates to semiconductor components with normally-off high electron mobility transistors.

BACKGROUND

In conventional high electron mobility transistors (HEMTs), also referred to as heterostructure FETs (HFETs) or modulation-doped FETs (MODFETs), a current flows between source and drain terminals of the device even if the gate electrode is grounded. That is, a thin electrically conductive channel (inversion layer) exists between the source and drain terminals. As such, the device is commonly referred to as being normally-on.

The normally-on feature of HEMTs is an intrinsic property of e.g. GaN technology, and restricts the range of applications for GaN technology to those applications where a power supply is available to generate the negative voltages necessary to turn the GaN device off. Moreover, the normally-on feature complicates the design of the circuitry needed to drive GaN transistors. In particular, unintended short-circuits may occur due to the normally-on property of such transistors. The same problem arises with semiconductor components based on other semiconductor materials than GaN.

Hence, there is a need for an improved solution.

SUMMARY

According to an embodiment of a semiconductor component, the semi-conductor component comprises a semiconductor body, a first main contact pad, a second main contact pad, a normally-on first transistor monolithically integrated in the semiconductor body and a normally-off second transistor monolithically integrated in the semiconductor body. In the sense of the present invention, a transistor is a "normally-on" transistor if achieving the blocking state of that transistor requires to actively switch the transistor off. Accordingly, a transistor is a "normally-off" transistor if achieving the conducting state of that transistor requires to actively switch the transistor on.

The first transistor is a high electron mobility transistor (HEMT) comprising a first gate electrode and has a first load path controllable via a first gate electrode. The second transistor comprises a second gate electrode and a second load path controllable via the second gate electrode. Optionally, the second transistor may also be a high electron mobility transistor (HEMT). The first load path and the second load path are electrically connected in series between the first main contact pad and the second main contact pad. In the sense of the present invention, a "load path" of a transistor is an electrical path formed between source and drain that can be switched on (electrically conductive state) and off (electrically blocking state) via a control signal applied to gate. To switch a transistor on or off means to switch its load path on or off, respectively.

In a method for operating a semiconductor component, a semiconductor component is provided. The semiconductor component has a semiconductor body, a first main contact pad, a second main contact pad, a normally-on first transistor monolithically integrated in the semiconductor body and a normally-off second transistor monolithically integrated in the semi-conductor body. The first transistor is a high electron mobility transistor (HEMT) comprising a first gate electrode and has a first load path controllable via a first gate electrode. The second transistor comprises a second gate electrode and a second load path controllable via the second gate electrode. The second transistor may also be a high electron mobility transistor (HEMT). The first load path and the second load path are electrically connected in series between the first main contact pad and the second main contact pad. Also provided is a driver unit for driving (at least) the first transistor. At a first point of time, the driver unit is started up by applying a driver unit supply voltage to the driver unit. At a second point of time subsequent to the first point of time, the second transistor is switched on, wherein switching on takes place not before the driver unit is ready to provide a first control voltage signal sufficient to completely switch the first transistor off.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 4 illustrates a cross-sectional schematic view of a bidirectional semiconductor component having a design as described with reference to FIGS. 1A to 1C but wherein a common electrode which is a source electrode of the first transistor and a drain electrode of the second transistor is not lead out of the semiconductor component.

FIG. 5 illustrates a cross-sectional schematic view of a bidirectional semiconductor component having a design as described with reference to FIGS. 3A to 3C but wherein a common electrode which is a source electrode of the first transistor and a source electrode of the third transistor is not lead out of the semiconductor component.

DETAILED DESCRIPTION

Figure 1A:
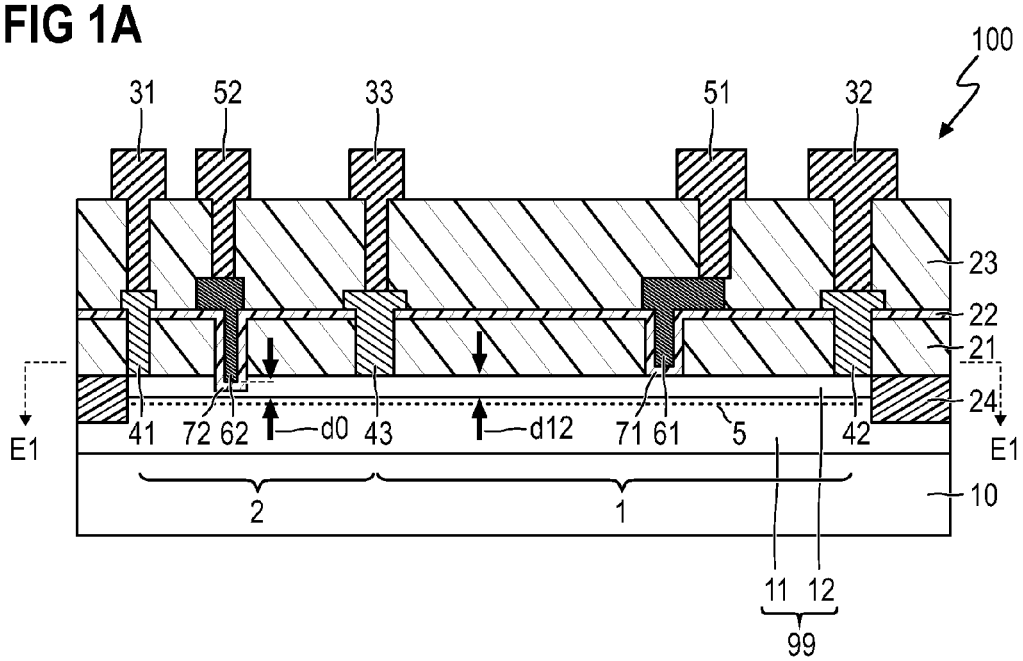
FIG. 1A illustrates a cross-sectional schematic view of a semiconductor component with a normally-off HEMT and a normally-on HEMT monolithically integrated in a common semiconductor body.

FIG. 1A illustrates an embodiment of a semiconductor component 100. A circuit diagram illustrating in particular the semiconductor component 100 of the semiconductor component 100 is illustrated in FIG. 1C. In a semiconductor body 99 of the semiconductor component 100, a first transistor 1 and a second transistor 2 are monolithically integrated.

The semiconductor body 99 has a substrate 10, a first semiconductor layer 11 arranged on the substrate 10, and a second semiconductor layer 12 arranged on the first semiconductor layer. Optionally, the substrate 10 may comprise silicon. However, other materials may also be used.

The first semiconductor layer 11 is arranged between the substrate 10 and the second semiconductor layer 12. Between the first semiconductor layer 11 and the second semiconductor layer 12 a heterojunction is formed. In the sense of the present invention, a "heterojunction" is a junction formed between two adjoining semiconductor materials having unequal band gaps (i.e. the energy gaps between the valence band and the conduction band). For instance, the difference between the band gaps of the first and second semiconductor layers 11, 12 may be at least 0.3 eV (electron volts) and/or less than or equal to 1.4 eV.

In order to laterally isolate the heterojunction, a lateral electric isolation 24 is provided. The lateral electric isolation 24 may be produced, for instance, in the first and second semiconductor layers 11, 12 by implanting Argon so as to fully amorphize those layers 11, 12 in the region of the later lateral electric isolation 24. A further possibility is to produce a void in the region of the later lateral electric isolation 24, for instance by etching away the semiconductor material from that region, and to subsequently fill a dielectric material into the void. Alternatively, the void may be left open. The first semiconductor layer 11 is also referred to as "buffer layer," and the second semiconductor layer 12 is also referred to as "barrier layer," Optionally, the second semiconductor layer 12 may be formed of a number of sublayers.

The first semiconductor layer 11 comprises a first band gap, and the second semiconductor layer 12 comprises a second band gap greater than the first band gap. For instance, the difference between the second band gap and the first band gap may be as large as more than 2 eV. However, first and second semiconductor layers 11, 12 having a lower band gap difference may also be used.

Due to the band gap difference between the first and second semiconductor layers 11, 12, electrons drop from second semiconductor layer 12 into the first semiconductor layer 11 and form a two-dimensional electron gas 5 ('2DEG') in the first semiconductor layer 11. The 2DEG 5 serves as an electrically conductive channel for the first transistor 1, the second transistor 2 and, in other embodiments described below with reference to FIGS. 2A to 2C, 3A to 3C and 5, also a third transistor 3 monolithically integrated in the semiconductor body 99.

In order to achieve the band gap difference, the first semiconductor layer 11 and the second semiconductor layer 12 are made of different semiconductor basic materials or semiconductor material compositions, or they are made of the same semiconductor basic materials but with different types and/or concentrations of electrically active dopants. The first semiconductor layer 11 may be undoped or substantially undoped with electrically active dopants. That is, the first semiconductor layer 11 may be not n-doped or substantially not n-doped, and further be not p-doped or substantially not p-doped. The second semiconductor layer 12 may also be undoped or substantially undoped with electrically active dopants. That is, the second semiconductor layer 12 may be not n-doped or substantially not n-doped, and further be not p-doped or substantially not p-doped. Alternatively, the second semiconductor layer 12 may be n-doped. In the sense of the present invention, "substantially undoped" means that there is (only) an unintentional electrically active doping.

In principle, the first semiconductor layer 11 and the second semiconductor layer 12 may consist of or comprise any materials causing a 2DEG 5 at the interface between the first semiconductor layer 11 and the second semiconductor layer 12.

For instance, in one embodiment, the first semiconductor layer 11 may consist of or comprise first aluminum (Al) concentration lower than a second aluminum concentration of the second semiconductor layer 12. Thereby, the content of aluminum (if any) in the first semiconductor layer 11 (GaN) is lower than the content of aluminum throughout the second semiconductor layer 12. In any embodiment, the aluminum contents of both the first and second semiconductor layers 11 and 12, respectively, may optionally be below 0.4 atom %, or even below 0.3 atom %.

Also optionally, the first semiconductor layer 11 may comprise aluminum gallium nitride and/or the second semiconductor layer 12 may comprise aluminum gallium nitride. Thereby, the second aluminum concentration of the second semiconductor layer 12 may be higher than the first aluminum concentration of the first semiconductor layer 11.

Optionally, a second semiconductor layer 12 may have a number of sublayers comprising aluminum gallium nitride with different Al concentrations.

According to one embodiment, the second semiconductor layer 12 consists of or comprises a material that is lattice matched to GaN e.g. such as In—AlN.

On the second semiconductor layer 12, a first dielectric layer 21, a second dielectric layer 22 and a third dielectric layer 23 are arranged. The second dielectric layer 22 is arranged between the first dielectric layer 21 and the third dielectric layer 23. The semiconductor component 100 further comprises, spaced distant from one another, a first main electrode 41, a second main electrode 42, and a first intermediate electrode 43, each electrically contacting the second semiconductor layer 12.

The first transistor 1 is a normally-on HEMT (high electron mobility transistor) and comprises a first gate electrode 61, and a first load path formed between the first intermediate electrode 43 and the second main electrode 42. The first load path is controllable via the first gate electrode 61. A transistor is a "normally-on transistor" if in a state, in which the voltage between its gate electrode and its source electrode is zero, the load path is electrically turned on (i.e. in its conductive state). That is, in the example of the HEMT 1 of the present embodiment, without a sufficiently high voltage applied between the first gate electrode 61 the first intermediate electrode 43 there is no interruption of the 2 DEG underneath the first gate electrode 61. Turning the first transistor 1 off (i.e. in its blocking state) requires a suitable electric potential to be applied to the first gate electrode 61. Such an electric potential may be applied to a first gate contact pad 51 electrically connected to the first gate electrode 41.

In contrast, the second transistor 2 is a normally-off HEMT. The second transistor 2 comprises a second gate electrode 62, and a second load path formed between the first main electrode 41 and the first intermediate electrode 41. Optionally, the distance d0 between the second gate electrode 62 and the first semiconductor layer 11 may be less than the thickness d12 of the second semiconductor layer 12. Thereby, the thickness d12 has to be measured in a direction perpendicular to the junction between the first and second semiconductor layers 11 and 12, respectively. The second load path is controllable via the second gate electrode 62. A transistor is "a normally-off transistor" if in a state, in which the voltage between its gate electrode and its source electrode is zero, the load path is turned off (i.e. in its electrically blocking state). That is, in the example of the HEMT 2 of the present embodiment, without a sufficiently high voltage applied between the second gate electrode 62 and the first main electrode 41 the 2DEG underneath the first gate electrode 61 is interrupted. Turning the second transistor 2 on (i.e. in its electrically conductive state) requires a suitable electric potential to be applied to the second gate electrode 62. Such an electric potential may be applied to a second gate contact pad 52 electrically connected to the second gate electrode 42.

Referring additionally to FIG. 10, it can be seen that the first main electrode 41 may form a source electrode S2 of the second transistor 2, the second main electrode 42 may form a drain electrode D1 of the first transistor 1, and the first intermediate electrode 43 may form a source electrode 51 of the first transistor 1 and/or a drain electrode D2 of the second transistor 2.

In order to turn the second transistor 2 on, a suitable electric potential is to be applied to the second gate electrode 62. To this, a suitable voltage may be applied between the first main electrode 41 and the second gate electrode 62. In order to allow for applying an electric potential to the second gate electrode 62 from outside the semiconductor component 100, a second gate contact pad 52 electrically connected to the second gate electrode 62 and accessible from outside the semiconductor component 100 may be provided. The electric potential of the first main electrode 41 serves as a reference potential for a second control voltage signal CTRL2 applied to the second gate electrode 62, e.g. via the second gate contact pad 52.

Accordingly, in order to turn the first transistor 1 off, a suitable electric potential is to be applied to the first gate electrode 61. To this, a suitable voltage may be applied between the first intermediate electrode 43 and the first gate electrode 61. In order to allow for applying an electric potential to the first gate electrode 61 from outside the semiconductor component 100, a first gate contact pad 51 electrically connected to the first gate electrode 61 and accessible from outside the semiconductor component 100 may be provided. The electric potential of the first intermediate electrode 43 serves as a reference potential for a first control voltage signal CTRL1 applied to the first gate electrode 61, e.g. via the first gate contact pad 51.

It is to be noted that using low voltage control voltage signals CTRL1, CTRL2 and, as will be described below, also CTRL3, e.g. having maximum absolute values of less than 20 V, allows the usage of a relatively simple and inexpensive low-voltage driver unit 200 providing the control voltage signals CTRL1, CTRL2, and, if provided, CTRL3.

Optionally, a first gate resistor R1 (not depicted in FIG. 1A) may be connected between the first gate electrode 61 and the first gate contact pad 51. Also optionally, a second gate resistor R2 (not depicted in FIG. 1A) may be connected between the second gate electrode 62 and the second gate contact pad 52. The first gate resistor R1 and/or the second gate resistor R2 may be monolithically integrated in the semiconductor body 99.

Different from the cross-sectional view of FIG. 1A, the first main contact pad 31, the second main contact pad 32, the first intermediate contact pad 33, the first gate contact pad 51 and the second gate contact pad 52 are not required to have a common sectional plane.

Figure 1B:
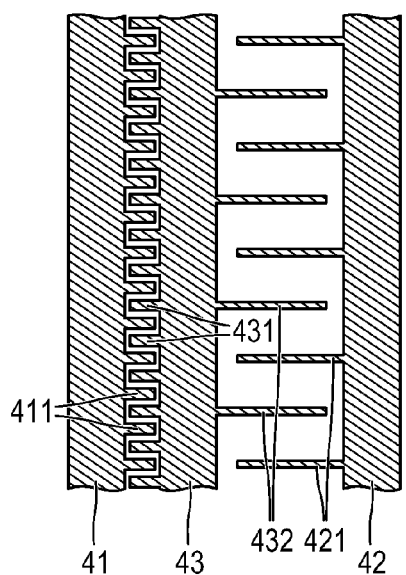
FIG. 1B illustrates a schematic cross-sectional view of a semiconductor component having the structure of the semiconductor component of FIG. 1A in a sectional plane E1-E1.
Figure 1C:
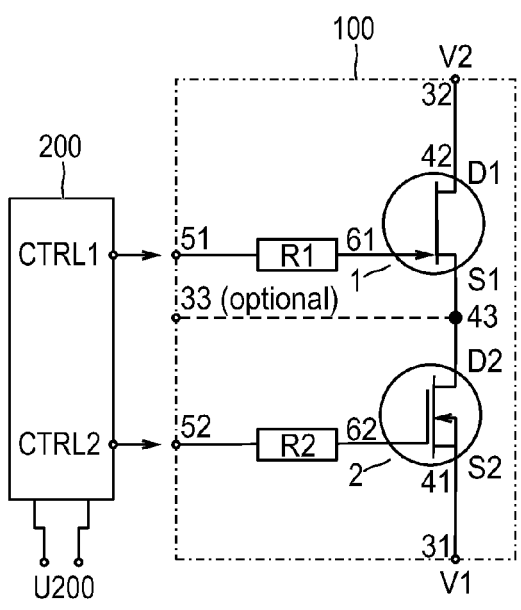
FIG. 1C illustrates a circuit diagram of the semiconductor component of FIGS. 1A and 1B.

FIG. 1B is a cross-sectional view of a semiconductor component 100 according to FIG. 1A in a sectional plane E1-E1. However, the gate electrodes 61 and 62 and the dielectric layers 21 and 22 are omitted in FIG. 1B so that only the first and second main electrodes 41, 42 and the first intermediate electrode 43 are depicted. As can be seen, the first intermediate electrode 43 may be arranged between the first main electrode 41 and the second main electrode 42.

Further, the first main electrode 41 may have a plurality of staggered first fingers 411, and the first intermediate electrode 43 may have a plurality of staggered first fingers 431 meshing with the first fingers 411 of the first main electrode 41. Then, the second main electrode 42 may have a plurality of staggered first fingers 421, and the first intermediate electrode 43 may have a plurality of staggered second fingers 432 meshing with the first fingers 421 of the second main electrode 42.

Figure 2A:
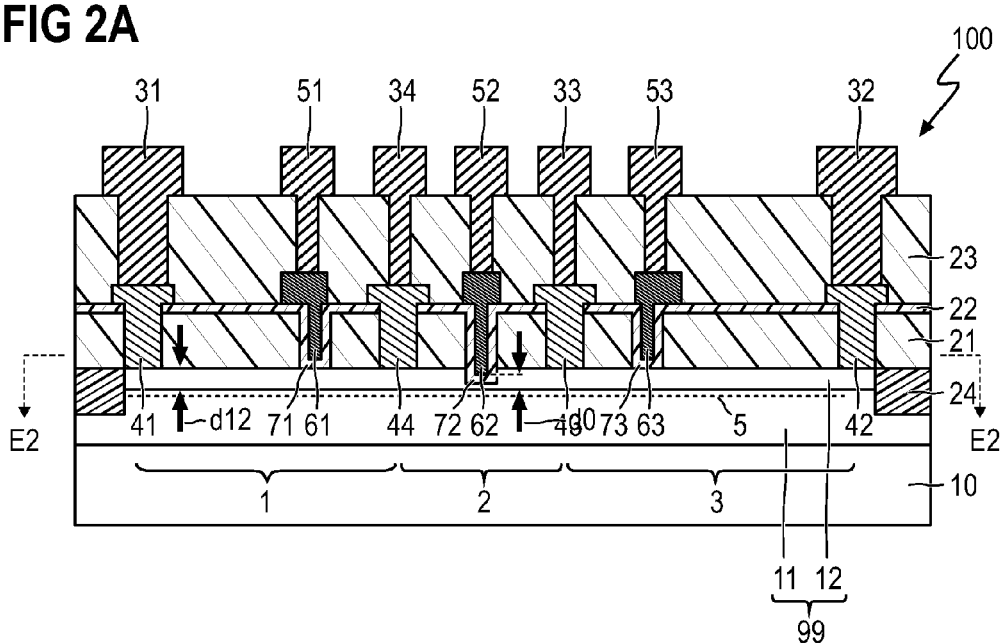
FIG. 2A illustrates a cross-sectional schematic view of a bidirectional semiconductor component with two normally-on HEMTs and one normally-off HEMT monolithically integrated in a common semiconductor body, wherein a load path of the normally-off HEMT is electrically connected in series between the load paths of the normally-on HEMTs.
Figure 3A:
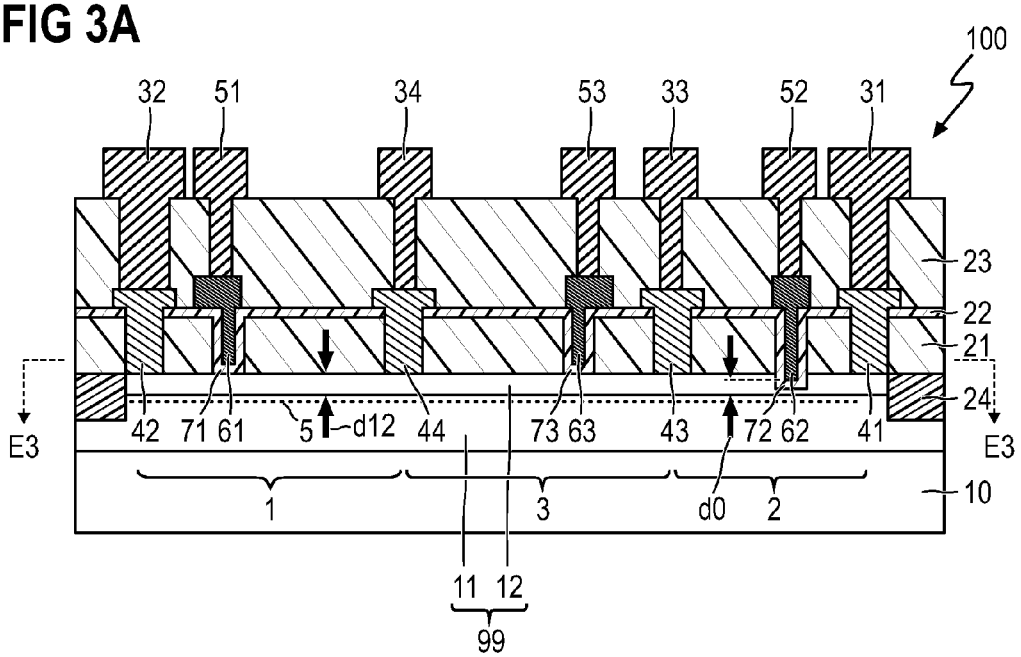
FIG. 3A illustrates a cross-sectional schematic view of a bidirectional semiconductor component with two normally-on HEMTs and one normally-off HEMT monolithically integrated in a common semiconductor body, wherein a load path of the normally-off HEMT is electrically connected in series between the load paths of the normally-on HEMTs.

Referring now to FIGS. 2A and 3A, there are illustrated further embodiments of a semiconductor component 100. In both cases, the semiconductor component 100 may be operated bidirectional. That is, the semiconductor component 100 is operable independently from the polarity of a voltage applied between the first and second main contact pads 31 and 32. That is, the difference between a first electric potential V1 applied to the first main contact pad 31 and a second electric potential V2 applied to the second main contact pad 32 may be positive or negative.

Figure 2B:
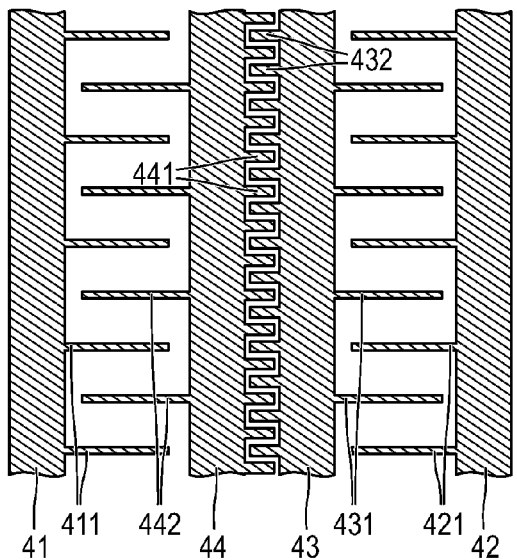
FIG. 2B illustrates a schematic cross-sectional view of a semiconductor component having the structure of the semiconductor component of FIG. 2A in a sectional plane E2-E2.
Figure 2C:
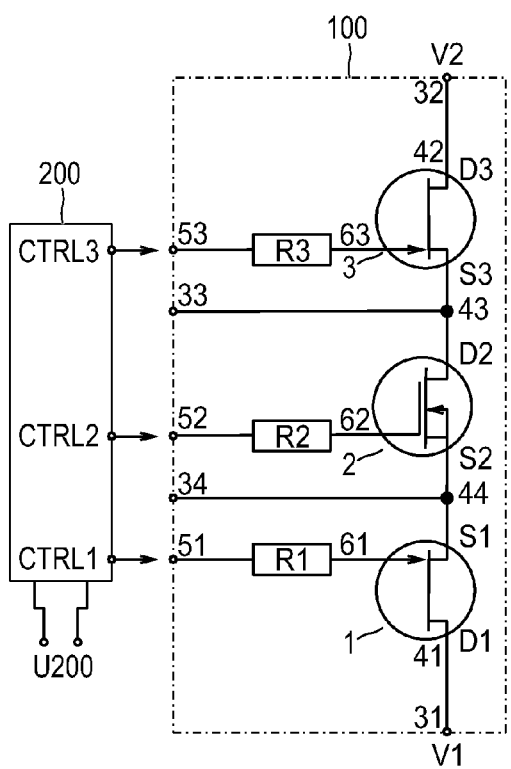
FIG. 2C illustrates a circuit diagram of the semiconductor component of FIGS. 2A and 2B.
Figure 3B:
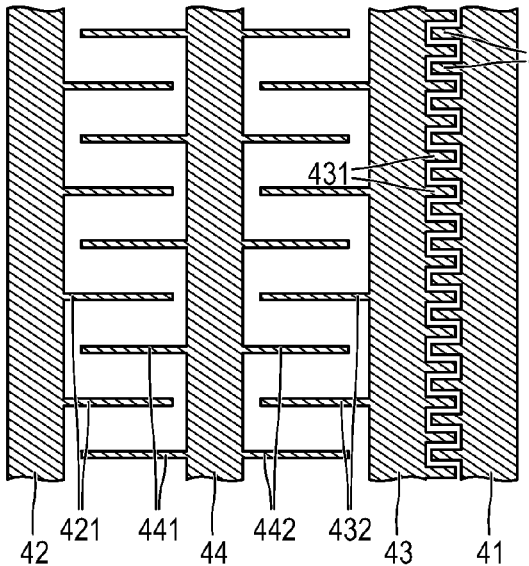
FIG. 3B illustrates a schematic cross-sectional view of a semiconductor component having the structure of the semiconductor component of FIG. 3A in a sectional plane E3-E3.
Figure 3C:
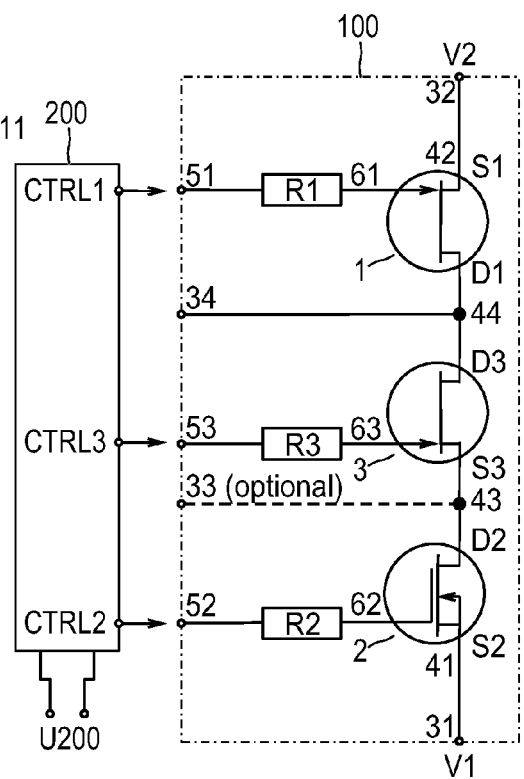
FIG. 3C illustrates a circuit diagram of the semiconductor component of FIGS. 3A and 3B.

A circuit diagram illustrating in particular the semiconductor component 100 of FIG. 2A is illustrated in FIG. 2C, and a circuit diagram illustrating in particular the semiconductor component 100 of FIG. 3A is illustrated in FIG. 3C.

In both embodiments of FIGS. 2A and 3A, the semiconductor body 99 and the substrate 10 may have the same structure and be formed from the same materials already described above with reference to the embodiment of FIGS. 1A to 1C.

In the semiconductor body 99 of FIG. 2A, a first transistor 1, a second transistor 2 and a third transistor 3 are monolithically integrated. The first transistor 1 is a normally-on HEMT and comprises a first gate electrode 61, and a first load path formed between the first main electrode 41 and a second intermediate electrode 44 electrically connected to the second semiconductor layer 12. The first load path is controllable via the first gate electrode 61.

Again, the second transistor 2 is a normally-off HEMT. The second transistor 2 comprises a second gate electrode 62, and a second load path formed between the second intermediate electrode 44 and the first intermediate electrode 43. The second load path is controllable via the second gate electrode 62.

Then, the third transistor 3 is a normally-on HEMT and comprises a third gate electrode 63, and a third load path formed between the first intermediate electrode 43 and the second main electrode 42. The third load path is controllable via the third gate electrode 63.

The second load path is electrically connected in series between the first load path and the third load path. If the second transistor 2 is turned on, it electrically connects the source electrode S1 (44) of the first transistor 1 to the source electrode S3 (43) of the third transistor 3.

Referring to FIGS. 2B and 2C, it can be seen that the first main electrode 41 may form a drain electrode D1 of the first transistor 1, the second main electrode 42 may form a drain electrode D3 of the third transistor 3, the first intermediate electrode 43 may form a source electrode S3 of the third transistor 3 and/or a drain electrode D2 of the second transistor 2, and the second intermediate electrode 44 may form a source electrode S2 of the second transistor 2 and/or a source electrode S1 of the first transistor 1.

In order to turn the second transistor 2 on, a suitable electric potential is to be applied to the second gate electrode 62. To this, a suitable voltage may be applied between the second intermediate electrode 44 and the second gate electrode 62. In order to allow for applying an electric potential to the second gate electrode 62, a second gate contact pad 52 electrically connected to the second gate electrode 62 and accessible from outside the semiconductor component 100 may be provided. The electric potential of the second intermediate electrode 44 serves as a reference potential for a second control voltage signal CTRL2 applied to the second gate electrode 62, e.g. via the second gate contact pad 52.

Accordingly, in order to turn the first transistor 1 off, a suitable electric potential is to be applied to the first gate electrode 61. To this, a suitable voltage may be applied between the second intermediate electrode 44 and the first gate electrode 61. In order to allow for application of an electric potential to the first gate electrode 61, a first gate contact pad 51 electrically connected to the first gate electrode 61 and accessible from outside the semiconductor component 100 may be provided. The electric potential of the second intermediate electrode 44 serves as a reference potential for a first control voltage signal CTRL1 applied to the first gate electrode 61, e.g. via the first gate contact pad 51.

Then, in order to turn the third transistor 3 off, a suitable electric potential is to be applied to the third gate electrode 63. To this, a suitable voltage may be applied between the first intermediate electrode 43 and the third gate electrode 63. In order to allow for applying an electric potential to the third gate electrode 63, a third gate contact pad 53 electrically connected to the third gate electrode 63 and accessible from outside the semiconductor component 100 may be provided. The electric potential of the first intermediate electrode 43 serves as a reference potential for a third control voltage signal CTRL3 applied to the third gate electrode 63, e.g. via the first gate contact pad 53.

FIG. 2B is a cross-sectional view of a semiconductor component 100 according to FIG. 2A in a sectional plane E2-E2. However, the gate electrodes 61, 62 and 63 and the dielectric layers 21 and 22 are omitted in FIG. 2B. As can be seen, the first intermediate electrode 43 may be arranged between the second main electrode 42 and the second intermediate electrode 44, and the second intermediate electrode 44 may be arranged between the first main electrode 41 and the first intermediate electrode 43.

Further, the first intermediate electrode 43 may have a plurality of staggered first fingers 431, and the second main electrode 42 may have a plurality of staggered first fingers 421 meshing with the first fingers 431 of the first intermediate electrode 43.

Then, the first intermediate electrode 43 may have a plurality of staggered second fingers 432, and the second intermediate electrode 44 may have a plurality of staggered first fingers 441 meshing with the second fingers 432 of the first intermediate electrode 43.

Furthermore, the first main electrode 41 may have a plurality of staggered first fingers 411, and the second intermediate electrode 44 may have a plurality of staggered second fingers 442 meshing with the first fingers 411 of the first main electrode 41.

In the embodiment of FIGS. 3A to 3C, the third load path is electrically connected in series between the first load path and the second load path.

Referring to FIGS. 3B and 3C, it can be seen that the first main electrode 41 may form a source electrode S2 of the second transistor 2, the second main electrode 42 may form a source electrode S1 of the first transistor 1, the first intermediate electrode 43 may form a source electrode S3 of the third transistor 3 and/or a drain electrode D2 of the second transistor 2, and the second intermediate electrode 44 may form a drain electrode D1 of the first transistor 1 and/or a drain electrode D3 of the third transistor 3.

In order to turn the second transistor 2 on, a suitable electric potential is to be applied to the second gate electrode 62. To this, a suitable voltage may be applied between the first main electrode 41 and the second gate electrode 62. In order to allow for applying an electric potential to the second gate electrode 62, a second gate contact pad 52 electrically connected to the second gate electrode 62 and accessible from outside the semiconductor component 100 may be provided. The electric potential of the first main electrode 41 serves as a reference potential for a second control voltage signal CTRL2 applied to the second gate electrode 62, e.g. via the second gate contact pad 52.

Accordingly, in order to turn the first transistor 1 off, a suitable electric potential is to be applied to the first gate electrode 61. To this, a suitable voltage may be applied between the second main electrode 42 and the first gate electrode 61. In order to allow for applying an electric potential to the first gate electrode 61, a first gate contact pad 51 electrically connected to the first gate electrode 61 and accessible from outside the semiconductor component 100 may be provided. The electric potential of the second intermediate electrode 44 serves as a reference potential for a first control voltage signal CTRL1 applied to the first gate electrode 61, e.g. via the first gate contact pad 51.

Then, in order to turn the third transistor 3 off, a suitable electric potential is applied to the third gate electrode 63. To this, a suitable voltage may be applied between the first intermediate electrode 43 and the third gate electrode 63. In order to allow for applying an electric potential to the third gate electrode 63, a third gate contact pad 53 electrically connected to the third gate electrode 63 and accessible from outside the semiconductor component 100 may be provided. The electric potential of the first intermediate electrode 43 serves as a reference potential for a third control voltage signal CTRL3 applied to the third gate electrode 63, e.g. via the first gate contact pad 53.

FIG. 3B is a cross-sectional view of a semiconductor component 100 according to FIG. 3A in a sectional plane E3-E3. However, the gate electrodes 61, 62 and 63 and the dielectric layers 21 and 22 are omitted in FIG. 3B. As can be seen, the first intermediate electrode 43 may be arranged between the first main electrode 41 and the second intermediate electrode 44, and the second intermediate electrode 44 may be arranged between the second main electrode 42 and the second intermediate electrode 44.

Further, the first intermediate electrode 43 may have a plurality of staggered first fingers 431, and the first main electrode 41 may have a plurality of staggered first fingers 411 meshing with the first fingers 431 of the first intermediate electrode 43.

Then, the second main electrode 42 may have a plurality of staggered first fingers 421, and the second intermediate electrode 44 may have a plurality of staggered first fingers 441 meshing with the first fingers 421 of the second main electrode 42. Furthermore, the first intermediate electrode 43 may have a plurality of staggered second fingers 432, and the second intermediate electrode 44 may have a plurality of staggered second fingers 442 meshing with the second fingers 432 of the first intermediate electrode 43.

In all embodiments of the present invention, in particular in the embodiments described above with reference to FIGS. 1A to 1C, 2A to 2C and 3A to 3C and the further embodiments described below, the semiconductor component 100 comprises a series connection with the load paths of the normally-on first transistor 1, the normally-of second transistor 2 and, if provided, the normally-on third transistor 3. According to the present invention, the normally-off second transistor 2 serves to avoid a short circuit of the series connection in a state, in which the driver unit 200 is not or not yet ready to provide a control signal CTRL1 and/or CTRL3 that is sufficient to turn the first transistor 1 and/or the third transistor 3 off.

After driver unit 200 is able to provide such (a) sufficient control signal CTRL1 and/or CTRL3, avoiding a short circuit of the series connection can now be realized by turning one or both of the first and third transistor 1, 3 off, and the second transistor 2 can be turned on and kept in switched on during the subsequent "normal switching operation" of the first transistor 1 and, if provided, the third transistor 3. During the "normal switching operation" of the first transistor 1 and, if provided, the third transistor 3, each of those transistors 1 and/or 3 can alternately be turned on and off many times. Hence, the "normal switching operation" may advantageously take place using one or more normally-on transistors 1, 3 instead one (or more) normally-off transistors 2.

FIG. 4 illustrates almost the same bidirectional semiconductor component 100 described with reference to FIGS. 1A to 1C. The sole difference is that the first intermediate electrode 43 is not lead out of the semiconductor component 100. That is, the first intermediate electrode 43 is not accessible from outside the semiconductor component 100 as there is, compared with the semiconductor component 100 of FIGS. 1A to 1C, no first intermediate contact pad 33 electrically connected to the first intermediate electrode 43.

FIG. 5 illustrates almost the same bidirectional semiconductor component 100 described with reference to FIGS. 3A to 3C. The sole difference is that the first intermediate electrode 43 is not lead out of the semiconductor component 100. That is, the first intermediate electrode 43 is not accessible from outside the semiconductor component 100 as there is, compared with the semiconductor component 100 of FIGS. 3A to 3C, no first intermediate contact pad 33 electrically connected to the first intermediate electrode 43.

In both embodiments of FIGS. 4 and 5, an external access of the first intermediate electrode 43 is not necessary as the "normal switching operation" requires the second transistor 2 being turned on. That is, there is only a low voltage drop across the load path of the second transistor 2 so that the electric potential of the first main electrode 41 can be used as the reference potential for driving the first transistor 1 (FIG. 4) and the third transistor 3 (FIG. 5).

With regard to the embodiments of FIGS. 2A to 2C and 3A to 5 it is to be noted that using low voltage control voltage signals CTRL1, CTRL2, and, if provided, CTRL3, e.g. having maximum absolute values of less than 20 V, allows the usage of a cheap low-voltage driver 200 unit providing the control voltage signals CTRL1, CTRL2 and, if required, CTRL3.

Optionally in each case, a first gate resistor R1 (not depicted in FIGS. 1A, 2A, 3A, 4 and 5) may optionally be connected between the first gate electrode 61 and the first gate contact pad 51, a second gate resistor R2 (not depicted in FIGS. 1A, 2A, 3A, 4 and 5) may optionally be connected between the second gate electrode 62 and the second gate contact pad 52, and a third gate resistor R3 (not depicted in FIGS. 2A, 3A and 5) may optionally be connected between the third gate electrode 63 and the third gate contact pad 53.

The first gate resistor R1 and/or the second gate resistor R2 and/or the third gate resistor R3 may be monolithically integrated in the semiconductor body 99. Each of the gate resistors R1, R2, and, if provided, R3 may have, for instance, a resistance of at least 0.5Ω (Ohms) or of at least 1.0Ω (Ohms).

Different from the cross-sectional view of FIGS. 1A, 2A, 3A, 4 and 5, the first main contact pad 31, the second main contact pad 32, the first intermediate contact pad 33, and, if provided, the second intermediate contact pad 34, the first gate contact pad 51, the second gate contact pad 52 and, if provided, the third gate contact pad 53 are not required to have a common sectional plane.

Figure 6:
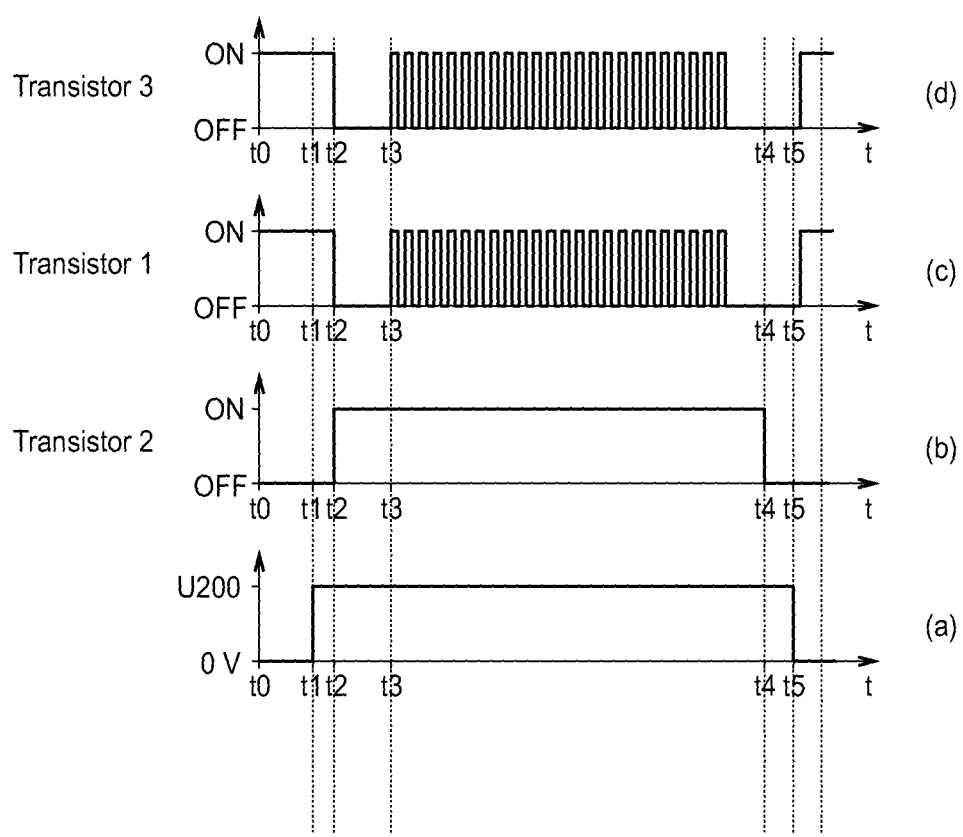
FIG. 6 illustrates a timing diagram for a possible operation of the semiconductor components of FIGS. 1A to 4.

Referring now to FIG. 6, there is illustrated a schematical timing diagram for a possible operation of one of the above-described semiconductor components 100. The timing diagram includes four sub-diagrams (a), (b), (c) and (d). All sub-diagrams (a), (b), (c) and (d) depend on the time t and have the same time scaling. Sub-diagram (d) only applies if there is a third transistor 3 monolithically integrated in the semiconductor body 99.

Sub-diagram (a) illustrates the time curve of a driver unit supply voltage U200 that serves as a power supply for a driver unit 200, see FIGS. 1C, 2C and 3C, used for driving at least the second transistor 2, optionally also the first transistor 1 and/or the third transistor 3. Sub-diagrams (b), (c) and (d) illustrate the switching state of the transistors 1, 2 and 3, respectively, dependent on the time t.

At a point of time t0, the semiconductor component 100 and the driver unit 200 are switched off. Hence, the load paths of the (normally-on) first transistor 1 and, if provided, the (normally-on) third transistor 3 are electrically conducting. If in this state different electric potentials V1 and V2 are applied to the first main contact pad 31 and the second main contact pad 32, respectively, the (normally-off) second transistor 2 prevents a short-circuit current between the first main contact pad 31 and the second main contact pad 32.

In order to start up and properly drive the semiconductor component 100, the driver unit 200 is also required to properly work. To this, a driver unit supply voltage U200 is supplied to the driver unit 200 at a first point of time t1 subsequent to t0. Due to internal capacities etc. of the driver unit 200 and e.g. the interface between the driver unit 200 and the second gate electrode 62, after having received the driver unit supply voltage U200, the driver unit 200 is not immediately able to provide a first control voltage signal CTRL1 sufficient to switch the first transistor 1 completely off, and, in case there is a third transistor 3, not immediately able to provide a third control voltage signal CTRL3 sufficient to switch the third transistor 3 completely off. Hence, to avoid the mentioned short circuit, the second transistor 2 is kept in its blocking state, e.g. remains in its off-state at least until the driver unit 200 is ready to provide a first control voltage signal CTRL1 sufficient to completely switch the first transistor 1, and, if provided, also the third transistor 3 off. If the driver unit driver unit 200 is ready to provide a first control voltage signal CTRL1 sufficient to completely switch the first transistor 1, and, if provided, also the third transistor 3 off, the second transistor 2 is switched on and may remain continuously switched on during following cycling operations ("normal switching operation") of the first and/or third transistors 1 and 3, respectively. In case of one cycling operation only, the cycling operation starts at a third point of time t3 subsequent to the second point of time t2. In case of two cycling operations, both or one of the cycling operations start at a third point of time t3 subsequent to the second point of time t2. It is to be noted, that switching the second transistor 2 on may take place at or after the second point of time t2, but not earlier than the second point of time t2. The cycling operation(s) last for a time Δt1 (transistor 1) and Δt3 (transistor 3, if provided), respectively. In principle, any desired timing of the cycling operation(s) may be used. Optionally, in case there is a first transistor 1 and a third transistor 3, both the first and third transistors 1, 3 may be repeatedly and simultaneously switched on and off. That is, the third transistor 3 is always switched on if the first transistor is switched on, and the third transistor 3 is always switched off if the first transistor 1 is switched off. In this case, their cycling operations are identical and Δt3 is equal to Δt1.

After the cycling operation(s) has/have finished, the operation of the semiconductor component 100 and the driver unit 200 can be terminated, for instance by switching all power supplies (e. g. U200 and V2-V1) off. However, simply switching the supply voltage U200 of the driver unit 200 off might cause a damage of the semiconductor component 100 if, due to switching delays, the first, second and (if provided) third transistors 1, 2, and 3 remain switched on whilst a significant voltage V2-V1 is still applied between the first main contact pad 31 and the second main contact pad 32. Hence, the driver unit 200 is shut down by switching the second transistor 2 off at a fourth point of time t4 subsequent to the third point of time t3, and the driver unit supply voltage U200 is removed from the driver unit 200 at a fifth point of time t5 subsequent to the fourth point of time t4. Thereby, removing the driver unit supply voltage U200 from the driver unit 200 takes place not earlier than it is ensured that the second transistor 2 is indeed switched off. "Indeed" means that the second load path is in its blocking state. From then on, the second transistor 2 remains switched off. The first, and if provided, third transistors 1, 3 may be actively switched on by the driver unit 200 at any point of time t1+Δt1, t3+Δt3 after the respective cycling operation is completed, or automatically switch in its normally on state by removing the driver unit supply voltage U200 from the driver unit 200. As depicted in FIG. 6 for the latter case, the on-status of the first and third transistors 1, 3 may be delayed compared to the removal of the removal of the driver unit supply voltage U200 due to switching delays and residual charges stored in capacities of the system.

Ensuring that the second transistor 2 is indeed switched off may take place, simply by waiting for a certain duration that is longer than a switching delay for switching the second transistor 2 off. That switching delay depends on the configuration of the system with the semiconductor component 100 and the driver unit 200.

In the above embodiments, the second transistor 2 may be a low voltage transistor, that is, a transistor having a low (maximum) blocking voltage capability, e.g. less than 100 V. In contrast, the first transistor 1 and, if provided, the third transistor 3 may be high voltage transistors, that is, transistors having a high (maximum) blocking voltage capability, e.g. at least 600 V. The advantage of a semiconductor component 100, in which the second transistor 2 is a low voltage transistor is that there are low requirements for the structure and the production of the second transistor 2. In particular if the second transistor 2 is a gallium nitride based transistor and has a gate dielectric 71, there is an advantage as the production of a gate dielectric sufficient to stand high voltages as they appear in a high voltage transistor is demanding. However, it is to be noted, that the second transistor 2 is not required to have a gate dielectric 71. Instead, also any other gate technologies like a p-doped gate electrode forming a junction with the second semiconductor layer 12 may be used, or instead of a second gate electrode 62 extending into a recess formed in the second semiconductor layer 12, a depletion area formed with fluor-implantation may be used without forming a recess in the second semiconductor layer 12.

Then, any of the described second transistors 2 may require only a low voltage to be fully switched on (to be applied between S2 and the second gate electrode 61), e.g. less than 3 V. This avoids a performance degradation of the second transistor 2 due to charge injection into the second gate dielectric 72 (if provided). The $Q_{GD}/Q_{GS}$ ratio of the second transistor 2 may be low ($Q_{GD}$ is the gate-drain-charge and $Q_{GS}$ the gate-source-charge). The second transistors 2 may have also have a low threshold voltage $V_{TH}$, e.g. less than 1 V.

What is claimed is:

1. A semiconductor component, comprising:
   a semiconductor body;
   a first main contact pad;
   a second main contact pad;
   a normally-on first transistor monolithically integrated in the semiconductor body; and
   a normally-off second transistor monolithically integrated in the semiconductor body;
   wherein the first transistor is a high electron mobility transistor comprising a first gate electrode and a first load path controllable via a first gate electrode;
   wherein the second transistor comprises a second gate electrode and a second load path controllable via the second gate electrode;
   wherein the first load path and the second load path are electrically connected in series between the first main contact pad and the second main contact pad;
   wherein the semiconductor body comprises a first semiconductor layer and a second semiconductor layer arranged on the first semiconductor layer; and wherein the first semiconductor layer and the second semiconductor layer form a heterojunction;
   wherein the first semiconductor layer comprises a first band gap; and wherein the second semiconductor layer comprises a second basic band gap greater than the first band gap; and
   wherein the first semiconductor layer comprises aluminum gallium nitride and has a first aluminum concentration; and wherein the second semiconductor layer comprises aluminum gallium nitride and has a second aluminum concentration higher than the first aluminum concentration.

2. The semiconductor component of claim 1, wherein the first transistor comprises a first blocking voltage capability higher than a second blocking voltage capability of the second transistor.

3. The semiconductor component of claim 1, wherein the first transistor is a high voltage transistor comprising a first blocking voltage capability of at least 600 V.

4. The semiconductor component of claim 1, wherein the second transistor is a low voltage transistor comprising a second blocking voltage capability of less than 100 V.

5. The semiconductor component of claim 1, wherein the first semiconductor layer is not or substantially not n-doped; and not or substantially not p-doped.

6. The semiconductor component of claim 1, wherein the second semiconductor layer is not or substantially not n-doped and not or substantially not p-doped; or n-doped.

7. The semiconductor component of claim 1, wherein a difference between the second band gap and the first band gap is at least one of:
   at least 0.3 eV; and less than or equal to 1.4 eV.

8. The semiconductor component of claim 1, wherein at least one of the first semiconductor layer and the second semiconductor layer comprises a basic material which is gallium nitride.

9. The semiconductor component of claim 1, comprising a first gate dielectric arranged between the first gate electrode and both the first semiconductor layer and the second semiconductor layer, the first gate dielectric electrically insulating the first gate electrode from both the first semiconductor layer and the second semiconductor layer.

10. The semiconductor component of claim 1, comprising a second gate dielectric arranged between the second gate electrode and both the first semiconductor layer and the second semiconductor layer, the second gate dielectric electrically insulating the second gate electrode from both the first semiconductor layer and the second semiconductor layer.

11. The semiconductor component of claim 1, comprising a simply-connected dielectric layer comprising a first section and a second section,
the first section forming a first gate dielectric arranged between the first gate electrode and both the first semiconductor layer and the second semiconductor layer, the first gate dielectric electrically insulating the first gate electrode from both the first semiconductor layer and the second semiconductor layer; and
the second section forming a second gate dielectric arranged between the second gate electrode and both the first semiconductor layer and the second semiconductor layer, the second gate dielectric electrically insulating the second gate electrode from both the first semiconductor layer and the second semiconductor layer.

12. The semiconductor component of claim 1, wherein a distance between the second gate electrode and the first semiconductor layer is less than a thickness of the second semiconductor layer.

13. The semiconductor component of claim 1, comprising a normally-on third transistor a third gate electrode and a third load path controllable via the third gate electrode, wherein the first load path, the second load path and the third load path are electrically connected in series between the first main contact pad and the second main contact pad.

14. The semiconductor component of claim 13, wherein the second load path is electrically connected between the first load path and the third load path.

15. The semiconductor component of claim 13, wherein the third load path is electrically connected between the first load path and the second load path.

16. A method for operating a semiconductor component, the method comprising: providing a semiconductor component comprising a semiconductor body, a first main contact pad, a second main contact pad, a normally-on first transistor monolithically integrated in the semiconductor body and a normally-off second transistor monolithically integrated in the semiconductor body, wherein
the first transistor is a high electron mobility transistor comprising a first gate electrode and a first load path controllable via a first gate electrode;
the second transistor comprises a second gate electrode and a second load path controllable via the second gate electrode; and
the first load path and the second load path are electrically connected in series between the first main contact pad and the second main contact pad;
providing a driver unit for driving the first transistor;
starting up the driver unit by applying a driver unit supply voltage to the driver unit at a first point of time;
switching on the second transistor, at a second point of time subsequent to the first point of time, wherein switching on takes place not before the driver unit is ready to provide a first control voltage signal sufficient to completely switch the first transistor off.

17. The method of claim 16, wherein the first transistor is switched on and the second transistor is off at the first point in time, and wherein the first transistor is switched OFF and the second transistor is switched ON at the second point in time.

18. The method of claim 16, comprising:
starting to repeatedly switch the first transistor on and off from a third point of time subsequent to the second point of time whilst the second transistor remains switched on.

19. The method of claim 18, comprising:
shutting down the driver unit by
switching off the second transistor at a fourth point of time subsequent to at least one of the second point of time and the third point of time; and
removing the driver unit supply voltage from the driver unit at a fifth point of time subsequent to the fourth point of time whilst the second transistor remains switched off.

20. The method of claim 16, wherein the semiconductor component comprises a normally-on third transistor monolithically integrated in the semiconductor body, the third transistor being a high electron mobility transistor comprising a third gate electrode and a third load path controllable via a third gate electrode; and wherein the first load path, the second load path and the third load path are electrically connected in series between the first main contact pad and the second main contact pad.

21. The method of claim 20, comprising:
starting to repeatedly and synchronously switch both the first transistor and the third transistor on and off from a third point of time subsequent to the second point of time whilst the second transistor remains switched on.

22. The method of claim 21, wherein repeatedly and synchronously switching both the first transistor and the third transistor on and off is carried out such that
the third transistor is always switched on if the first transistor is switched on, and
the third transistor is always switched off if the first transistor is switched off.

23. The method of claim 21, wherein
the second load path is electrically connected between the first load path and the third load path; or
the third load path is electrically connected between the first load path and the second load path.

24. A semiconductor component, comprising:
a semiconductor body;
a first main contact pad;
a second main contact pad;
a normally-on first transistor monolithically integrated in the semiconductor body; and
a normally-off second transistor monolithically integrated in the semiconductor body;
wherein the first transistor is a high electron mobility transistor comprising a first gate electrode and a first load path controllable via a first gate electrode;
wherein the second transistor comprises a second gate electrode and a second load path controllable via the second gate electrode;
wherein the first load path and the second load path are electrically connected in series between the first main contact pad and the second main contact pad;
wherein the semiconductor body comprises a first semiconductor layer and a second semiconductor layer arranged on the first semiconductor layer; and wherein the first semiconductor layer and the second semiconductor layer form a heterojunction;

wherein the first semiconductor layer comprises a first band gap; and wherein the second semiconductor layer comprises a second basic band gap greater than the first band gap; and wherein a difference between the second band gap and the first band gap is at least one of: at least 0.3 eV; and less than or equal to 1.4 eV.

25. A semiconductor component, comprising:

a semiconductor body;

a first main contact pad;

a second main contact pad;

a normally-on first transistor monolithically integrated in the semiconductor body;

a normally-off second transistor monolithically integrated in the semiconductor body; and a normally-on third transistor;

wherein the first transistor is a high electron mobility transistor comprising a first gate electrode and a first load path controllable via a first gate electrode;

wherein the second transistor comprises a second gate electrode and a second load path controllable via the second gate electrode;

wherein the third transistor comprises a third gate electrode and a third load path controllable via the third gate electrode; and wherein the first load path, the second load path and the third load path are electrically connected in series between the first main contact pad and the second main contact pad.

26. A semiconductor component, comprising:

a semiconductor body;

a first main contact pad;

a second main contact pad;

a normally-on first transistor monolithically integrated in the semiconductor body; and a normally-off second transistor monolithically integrated in the semiconductor body;

wherein the first transistor is a high electron mobility transistor comprising a first gate electrode and a first load path controllable via a first gate electrode;

wherein the second transistor comprises a second gate electrode and a second load path controllable via the second gate electrode; and wherein the first load path and the second load path are electrically connected in series between the first main contact pad and the second main contact pad, and wherein the first gate electrode is electrically isolated from the first and second load path.

27. The semiconductor component of claim 26, wherein the first and second transistors are independently controllable.

* * * * *